United States Patent [19]

Iwatsu et al.

[11] Patent Number: 5,525,890

[45] Date of Patent: Jun. 11, 1996

[54] BATTERY UNIT AND BATTERY ENERGY BILLING METHOD

[75] Inventors: Satoshi Iwatsu; Kazunori Ozawa, both of Kanagawa; Masana Ugaji, Tokyo; Yoshio Nishi; Yasuhito Eguchi, both of Kanagawa, all of Japan

[73] Assignee: Sony Corporation, Tokyo, Japan

[21] Appl. No.: 101,768

[22] Filed: Aug. 4, 1993

[30] Foreign Application Priority Data

Aug. 18, 1992 [JP] Japan .................................... 4-241229

[51] Int. Cl.⁶ .......................... H01M 10/44; H01M 10/48
[52] U.S. Cl. ................... 320/14; 320/35; 320/43; 320/48
[58] Field of Search .................. 320/39, 14, 43, 320/48, 2, 35; 324/429, 430

[56] References Cited

U.S. PATENT DOCUMENTS

| | | | |
|---|---|---|---|
| 4,289,836 | 9/1981 | Lemelson | 429/61 |
| 4,553,081 | 11/1985 | Koenck | 320/35 X |
| 4,638,237 | 1/1987 | Fernandez | 320/48 |
| 4,725,784 | 2/1988 | Peled et al. | 320/48 X |
| 4,998,055 | 3/1991 | Nash et al. | 320/2 |
| 5,136,620 | 8/1992 | Eaves | 320/48 X |
| 5,144,218 | 9/1992 | Bosscha | 320/44 |

FOREIGN PATENT DOCUMENTS

| | | |
|---|---|---|
| 0425044 | 5/1991 | European Pat. Off. . |
| 0447928 | 9/1991 | European Pat. Off. . |
| 0476405 | 3/1992 | European Pat. Off. . |
| 56-028476 | 5/1981 | Japan . |
| 8912344 | 12/1989 | WIPO . |
| 9100625 | 1/1991 | WIPO . |

OTHER PUBLICATIONS

European Search Report, Nov. 11, 1993 (3 pages).

Primary Examiner—Peter S. Wong
Assistant Examiner—Edward Tso
Attorney, Agent, or Firm—Ronald P. Kananen

[57] ABSTRACT

A battery unit of a cartridge type for use as a power supply for electric motorcars, broadcasting apparatus and the like comprises a battery, a monitoring unit for monitoring the condition of the battery and storing information about the battery, a display for displaying data obtained by the monitoring unit, an I/O unit for sending out data representing the condition of the battery monitored by the monitoring unit to an external device, and a battery identification output unit for sending out a battery identification signal representing the type of the battery. The monitoring unit comprises a voltage measuring unit for measuring the supply voltage of the battery, a current measuring unit for measuring the current supplied from the battery, a temperature sensor for sensing the temperature of the battery, and a clock for indicating passage of time. The monitoring unit determines the quantity of residual electrical energy remaining in the battery when replacing the battery with a fully charged battery.

17 Claims, 12 Drawing Sheets

BATTERY UNIT AND BATTERY ENERGY BILLING METHOD

BACKGROUND OF THE INVENTION

1. Field of the Invention

The present invention relates to a battery unit and a battery energy billing method.

2. Description of the Related Art

Some battery-powered apparatus use electrical energy stored in a stationary battery unit and another battery-powered apparatus use electrical energy stored in a replaceable battery unit, such as a cartridge battery. When the stationary battery unit is used, the quantity of electrical energy used by the apparatus can be easily known from the quantity of electrical energy necessary for charging the stationary battery unit and the charge on the used electrical energy can be determined by multiplying the quantity of electrical energy used for charging by the power rate.

Generally, the replaceable cartridge battery for supplying electrical energy to mobile broadcasting apparatus, electric motors and the like is replaced with a fully-charged replaceable cartridge battery before the same is exhausted to obviate troubles. Accordingly, it is difficult to establish a battery energy billing method for the replaceable cartridge battery, particularly, when the supplier and the user of the replaceable cartridge battery are different. The difficulty in establishing a battery energy billing method is an impediment to the popularization of the replaceable cartridge battery.

If battery charging charge is fixed regardless of the degree of discharge of replaceable cartridge batteries, the battery energy charge will be excessively high and electrical energy is costly and the user will be worried about balancing saving power charge and obviating troubles resulting from the exhaustion of the replaceable cartridge battery.

SUMMARY OF THE INVENTION

Accordingly, it is an object of the present invention to provide a replaceable battery unit that enables the user to recognize the residual quantity of electrical energy, to pay reasonable power charge and to calculate the depreciation of the replaceable battery unit when replacing the same with a new one.

Another object of the present invention is to provide a battery energy billing method.

In one aspect of the present invention, a battery unit is provided with a computing means capable of counting the number of battery charging cycles to determine the quantity of residual electrical energy remaining in the battery of the battery unit.

In another aspect of the present invention, a battery unit is provided with a counting means for counting the number of battery charging cycles to determine the quantity of residual electrical energy remaining in the battery of the battery unit, and a display means for displaying information about the number of battery charging cycles.

In a third aspect of the present invention, a battery unit is provided with a counting means for counting the number of battery charging cycles to determine the quantity of residual electrical energy remaining in the battery of the battery unit, a display means for displaying information about the number of battery charging cycles, and an output means for providing the information about the number of battery charging cycles.

Preferably, the counting means is provided with a count correcting means for counting the number of battery charging cycles on the basis of the degree of charging and that of discharging.

Preferably, the counting means is provided with a temperature sensor, and at least either a temperature display means for displaying the temperature detected by the temperature sensor or an temperature data output means for providing data representing the temperature.

Preferably, the counting means is provided with a voltage measuring means, and at least either a voltage display means for displaying the voltage measured by the voltage measuring means or a voltage data output means for providing data representing the voltage.

Preferably, the counting means is provided with a computing means for computing the quantity of residual electrical energy on the basis of the voltage detected by the voltage measuring means, the temperature detected by the temperature sensor and the number of battery charging cycles counted by the counting means, and at least either a display means for displaying the quantity of residual electrical energy or a residual electrical energy data output means for providing data representing the quantity of residual electrical energy.

Preferably, the counting means is provided with an identification signal output means for providing an identification signal indicating the type of the battery of the battery unit.

Preferably, the counting means is provided with a connecting device for connecting the counting means to the output means.

Preferably, the connecting device is provided with an identification signal output means for providing an identification signal indicating the type of the battery of the battery unit.

In a fourth aspect of the present invention, a battery energy billing method comprises counting the number of battery charging cycles to determine the quantity of residual electrical energy remaining in the battery of a battery unit, and determining the charge on the quantity of used electrical energy.

Preferably, the battery is of a replaceable type.

Preferably, the battery is a lithium-ion secondary battery.

In the foregoing battery unit, the number of battery charging cycles is counted by the counting means. If necessary, the display means displays information about the number of charging cycles and the output means provides data representing the number of charging cycles. Preferably, the number of battery charging cycles is determined on the basis of the degree of charging and that of discharging. The temperature information provided by the temperature sensor and voltage information provided by the voltage measuring means improve the accuracy of the quantity of residual electrical energy.

The charge on used electrical energy is determined by counting the number of battery charging cycles, determining the quantity of used electrical energy on the basis of the number of battery charging cycles and multiplying the quantity of used electrical energy by a power rate.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1:
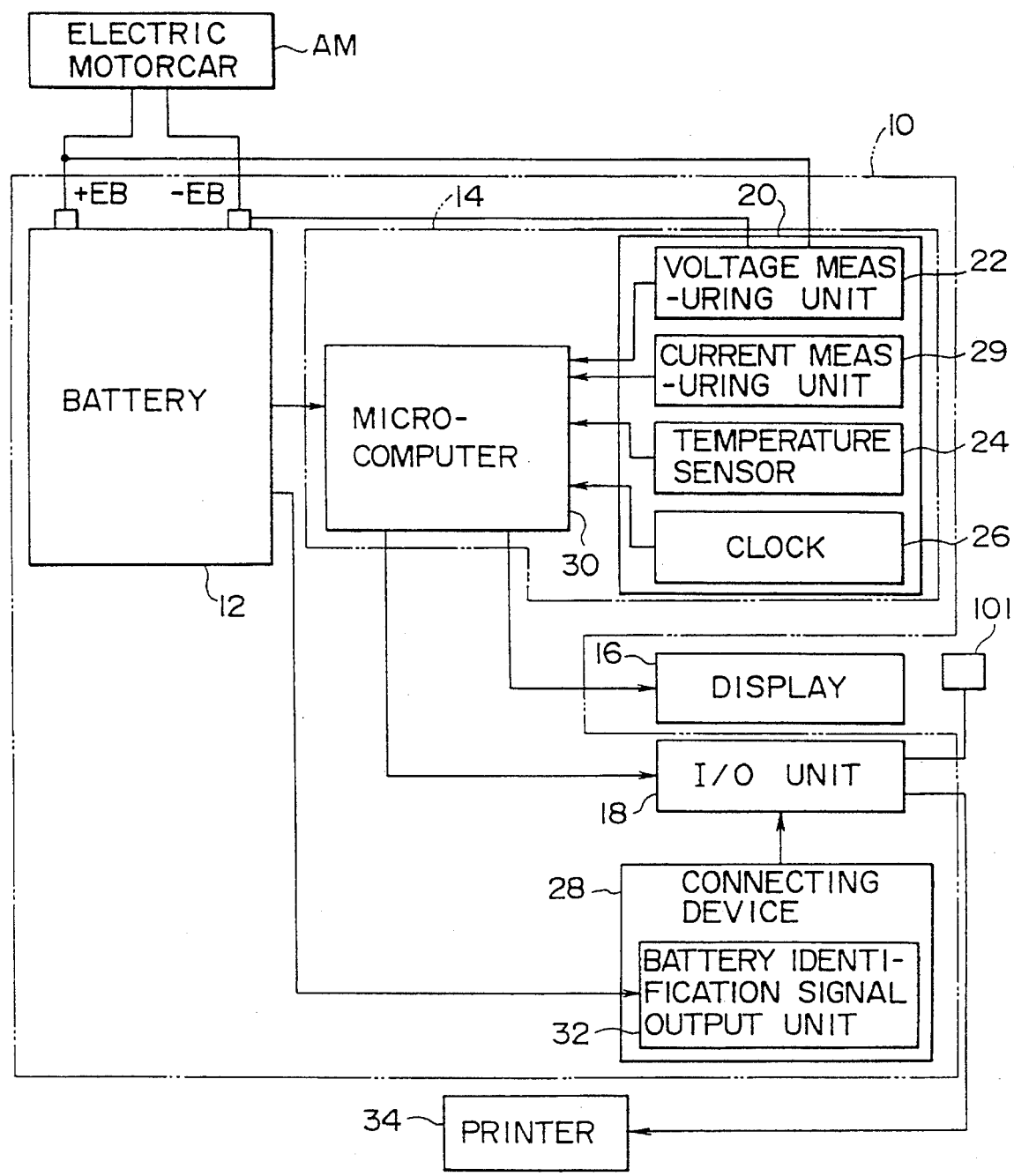
FIG. 1 is a block diagram of a battery unit in a preferred embodiment according to the present invention.

Referring to FIG. 1, a battery unit 10 in a preferred embodiment according to the present invention comprises, as principal components, a battery 12, a monitoring unit 14, an I/O unit 18 and a connecting unit 28.

The battery 12 is a replaceable cartridge battery, a replaceable lithium-ion secondary battery in this embodiment. The lithium-ion secondary battery has a discharge characteristic that the drop of the supply voltage with discharge time is comparatively small. For example, the final discharge voltage of the cells of the lithium-ion secondary battery having an initial supply voltage of 4.2 V can be set at 3.0 V. The battery 12 is used, for example, as a power supply for an electric motorcar. The battery unit 10 will be described as applied to an electric motorcar AM.

The monitoring unit 14 and the connecting device 28 are connected to the battery 12. The monitoring unit 14 comprises a measuring unit 20 and a microcomputer 30. A display 16 and the I/O unit 18 are connected to the monitoring unit 14. The measuring unit 20 comprises a voltage measuring unit 22, a temperature sensor 24, a clock 26 and a current detecting unit 29, which are connected to the microcomputer 30 included in the monitoring unit 14. The monitoring unit 14 counts the number N of charging cycles, namely, the number of times of charging of the battery 12, to determine the degree of deterioration of the battery 12. The voltage measuring unit 22 measures the supply voltage of the battery 12 or the supply voltage of each of the component cells of the battery 12 and provides voltage information. The temperature sensor 24 measures the temperature of the battery 12 or the temperature of the ambience surrounding the battery 12 and provides temperature information. The clock 26 indicates the passage of time.

The microcomputer 30 calculates the quantity of residual electrical energy remaining in the battery 12 on the basis of the voltage information provided by the voltage measuring unit 22, the temperature information provided by the temperature sensor 24, current information provided by the current detecting unit 29, and the number N of charging cycles. The connecting unit 28 is connected to the I/O unit 18 and provided with a battery identification signal output unit 32 which sends out a battery identification signal indicating the type of the battery 12, namely, a battery identifying signal indicating the lithium-ion secondary battery.

The display 16, such as a liquid crystal display or a CRT, is capable of displaying at least one of the number N of charging cycles, the temperature, the voltage, the current and the type of the battery 12. The I/O unit 18 is capable of sending out at least one of the pieces of information about the number N of charging cycles, the temperature, the voltage, the current and the type of the battery 12 to an external printer 34 and a host computer 101. Either the display 16 or the I/O unit 18 may be omitted. Preferably, the monitoring unit 14 is a microcomputer. The monitoring unit 14 has a memory storing data representing the degree of deterioration of the battery 12 determined on the basis of the number N of charging cycles.

Figure 2:
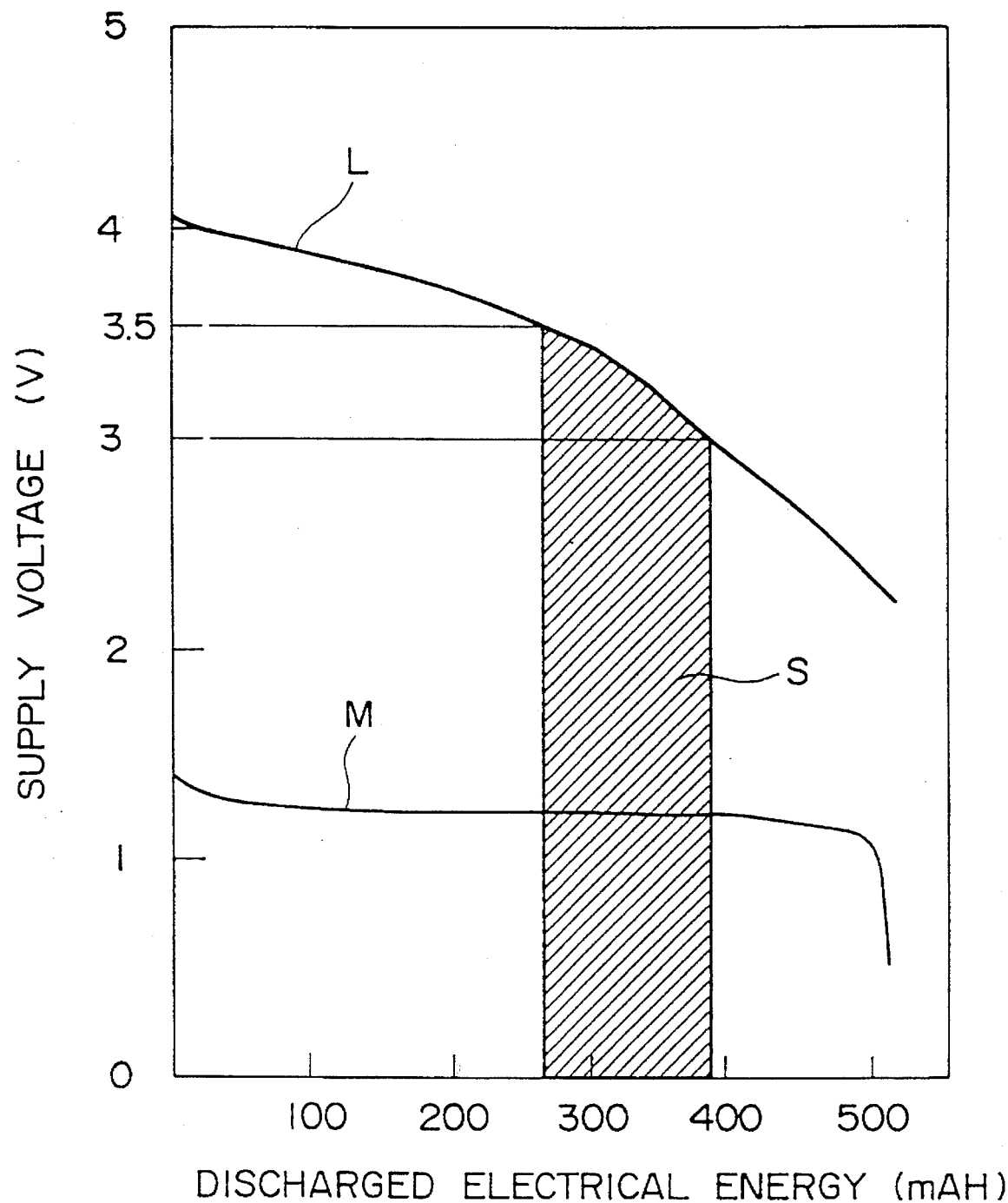
FIG. 2 is a graph showing the discharge characteristic of a battery employed in the present invention.

The lithium-ion secondary battery employed as the battery 12 comprises lithium-ion cells each having a discharge characteristic indicated by a discharge characteristic curve L shown in FIG. 2. The lithium-ion cell has a cathode formed of a carbonous material capable of being doped with a lithium dope, and an anode formed of a composite oxide composed of lithium and a transient metal. In FIG. 2, the discharge characteristic of a Ni-Cd cell is indicated by a discharge characteristic curve M for comparison. The discharge characteristic curve of the Ni-Cd cell is comparatively flat. As mentioned above, the discharge characteristic of the lithium-ion cell is different from that of the Ni-Cd cell. As indicated by the discharge characteristic curve L, the supply voltage of the lithium-ion cell is higher than that of the Ni-Cd cell or the like and varies greatly with discharge time from an initial discharge voltage of, for example, 4.2 V to a final discharge voltage of 3.0 V. Since the lithium-ion cell is deteriorated when the lithium-ion secondary battery is discharged completely, it is desirable to terminate the discharge of the lithium-ion secondary battery when the supply voltage of the cells thereof drops to a fixed limit discharge voltage of, for example, 3.5 V because the supply voltage of the lithium-ion cells drops sharply with discharge time from 3.5 V to the final discharge voltage of 3.0 V as indicated by the discharge characteristic curve L.

Figure 3:
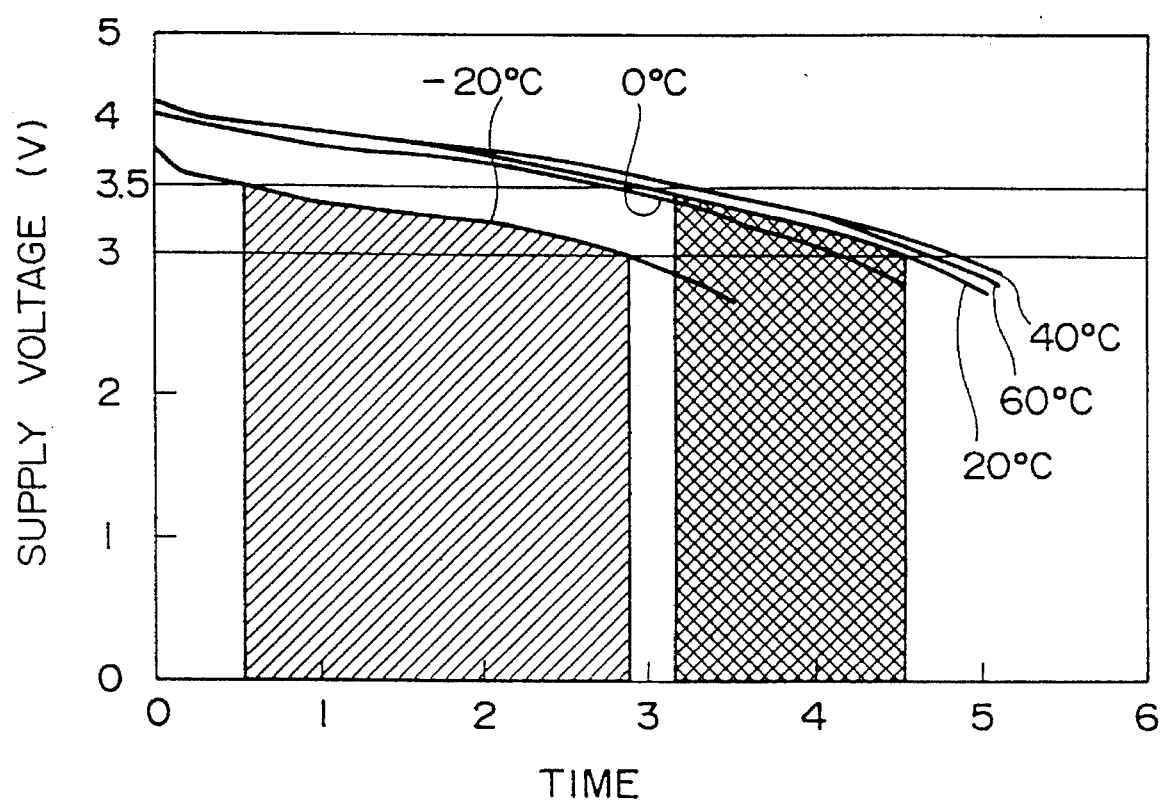
FIG. 3 is a graph showing the dependence of the discharge characteristic on temperature.

The discharge characteristic of the lithium-ion cells indicated by the discharge characteristic curve L in FIG. 2 is greatly temperature-dependent. Therefore, it is impossible to estimate the quantity of residual electrical energy remaining in the lithium-ion secondary battery from only the supply voltage. As shown in FIG. 3, the discharge characteristic of the lithium-ion cells at 20° C. and that of the same at −20° C. are greatly different from each other; the supply voltage of the lithium-ion cells drops to 3.5 V in a very short discharge time when the temperature of the lithium-ion secondary battery is −20° C. as compared with the time in which the supply voltage drops to 3.5 V when the temperature of the lithium-ion secondary battery is 20° C. Accordingly, it is necessary to measure the temperature of the battery 12 or the cells of the battery 12 in addition to the supply voltage of the battery 12 or the cells to estimate the quantity of residual electrical energy remaining in the battery 12. The battery 12 may be provided with a single temperature sensor 24 associated with one of the component cells of thereof or may be provided with a plurality of temperature sensors 24 associated respectively with the component cells thereof.

Figure 4:
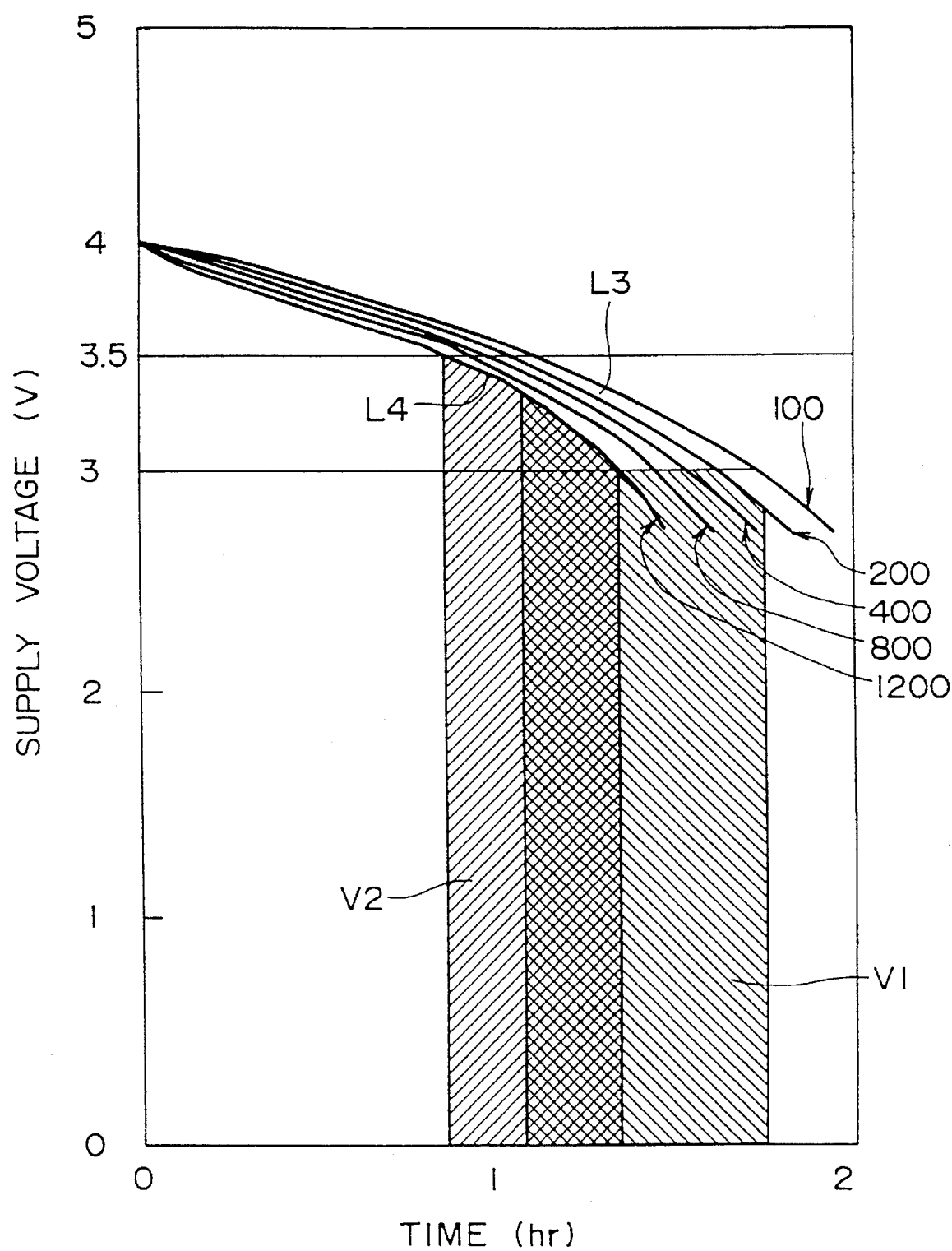
FIG. 4 is a graph showing the dependence of the variation of the output voltage of a battery with time on the number of charging cycles.

The discharge characteristic of the battery 12, i.e., the lithium-ion secondary battery, is dependent also on the number N of charging cycles. As is obvious from in FIG. 4 showing curves indicating the variation of the supply voltage of the lithium-ion cell with discharge time for different numbers N of discharge cycles, the greater the number N of charging cycles, the shorter the discharge time in which the supply voltage of the cells of the battery drops to the limit discharge voltage of 3.0 V, and the greater the number N of charging cycles the greater the derivative dv/dAH, i.e., voltage drop ratio, of the discharge characteristic curve at a voltage in the range of supply voltage of 3.0 to 3.3 V. Thus, the number N of charging cycles is an effective index of deterioration of the battery 12 or the termination of life of the battery 12. Generally, the life of the secondary battery is considered to have terminated when the capacity of the secondary battery drops to 60% to 80% of the initial capacity of the same.

Figure 5:
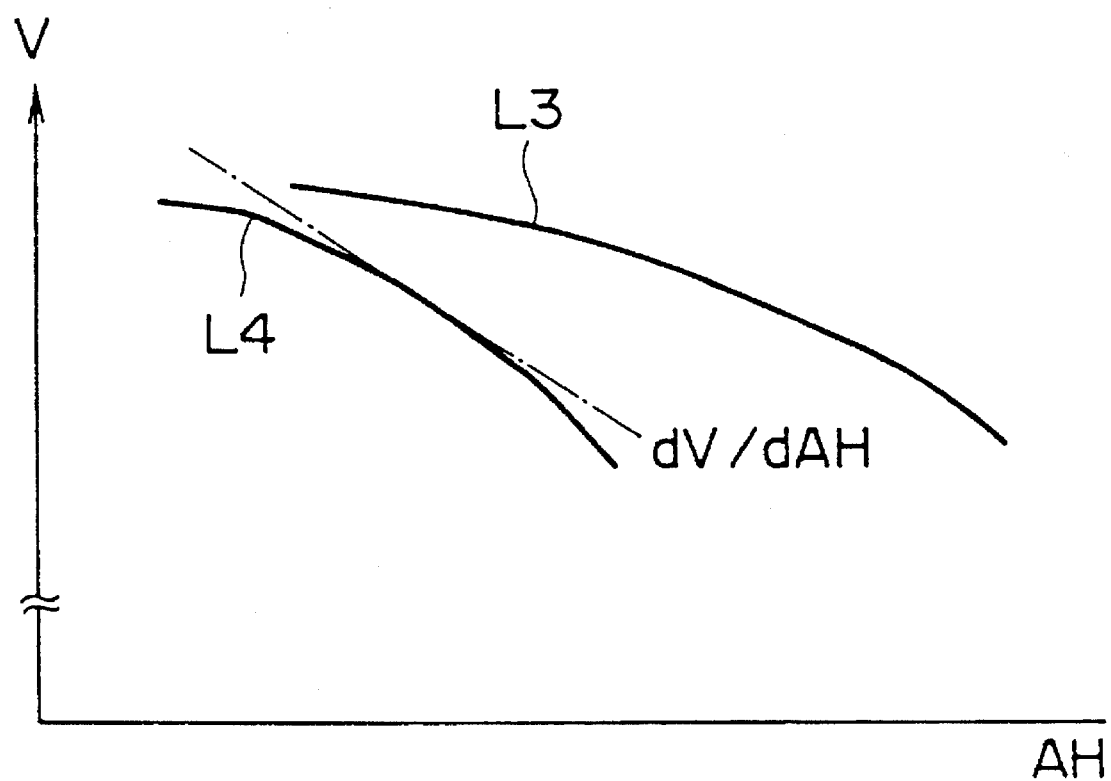
FIG. 5 is a graph of assistance in explaining voltage drop rate.

FIG. 5 shows a portion of the graph of FIG. 4. In FIG. 5, the discharge characteristic of the lithium-ion cell of the battery 12 subjected to 200 charging cycles is indicated by a discharge characteristic curve L3, the discharge characteristic of the lithium-ion cell of the battery 12 subjected to 1200 charging cycles is indicated by a discharge characteristic curve L4. The variation of the discharge characteristic curve with the number N of charging cycles is used for estimating the degree of deterioration of the battery 12; the microcomputer 30 of the monitoring unit 14 calculates the derivative dv/dAH when the present supply voltage of the component cells of the battery 12 measured by the voltage measuring unit 22 is in the range of 3.0 to 3.3 V, and finds the number N of charging cycles corresponding to the calculated derivative dv/dAH in a table showing the correlation between the derivative dv/dAH and the number N of charging cycles. The monitoring unit 14 has first and second memories, not shown. Data representing the correlation between the derivative dv/dAH and the number N of charging cycles for different temperatures is stored in the first memory, and the number $N_{old}$ of charging cycles counted in the preceding charging cycle is stored in the second memory.

Figure 6:
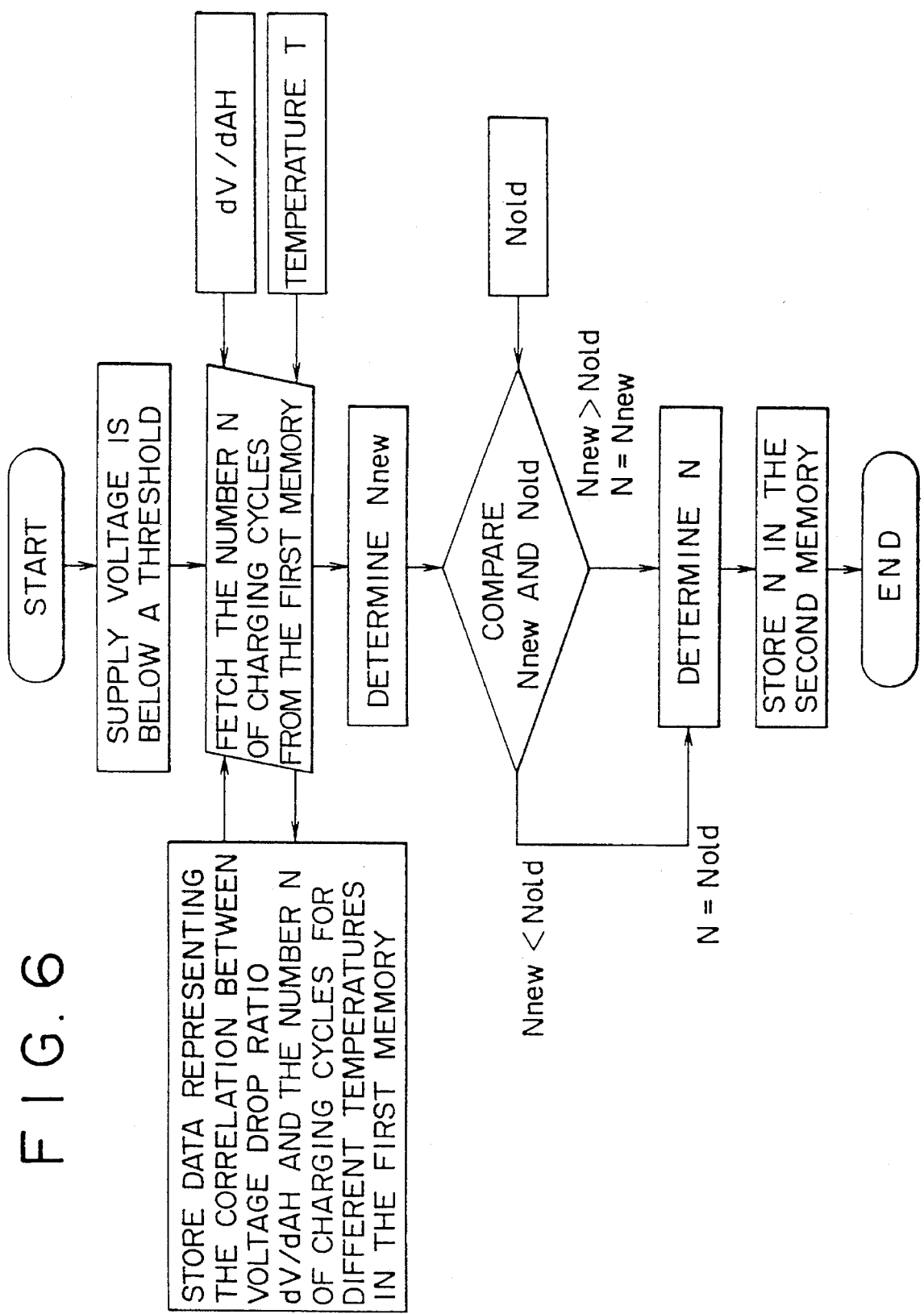
FIG. 6 is a flow chart of a procedure for determining the number of charging cycles in accordance with the present invention.

The microcomputer 30 of the monitoring unit 14 determines the number N of charging cycles by a procedure shown in FIG. 6. Upon the drop of the supply voltage of the component cells of the battery 12 below a specified voltage, for example, 3.3 V, the derivative dv/dAH at the present voltage calculated by the monitoring unit 14, and the temperature T of the battery 12 measured by the temperature sensor 24 are given to the microcomputer 30. Then, the microcomputer 30 of the monitoring unit 14 finds the number $N_{new}$ of charging cycles corresponding to the derivative dv/dAH and the temperature T, and compares the new number $N_{new}$ of charging cycles and the preceding number $N_{old}$ of charging cycles. When the present number $N_{new}$ of charging cycles is greater than the preceding number $N_{old}$ of charging cycles, the present number $N_{new}$ is stored as the number N of charging cycles in the second memory. When the preceding number $N_{old}$ of charging cycles is greater than the present number $N_{new}$, the preceding number $N_{old}$ is stored as the number N of charging cycles in the second memory.

The residual electrical energy WH remaining in the battery 12 is a function of the number N of charging cycles, temperature T and voltage V.

$$WH = f(N, T, V) \qquad (1)$$

Sufficient measured data of the number N of charging cycles, temperature T and voltage V for different conditions is available, the residual electrical energy WH remaining in the battery 12 can be expressed by the following approximation polynominal.

$$WH = f(N, T, V) = (aN^n + bN^{n-1} + cN^{n-2} + \ldots) \times \qquad (2)$$
$$(\alpha T^m + \beta T^{m-1} + \gamma T^{m-2} + \ldots) \times$$
$$(AV^p + BV^{p-1} + CV^{p-2} + \ldots)$$

The expression (2) is developed in series and the measured data is substituted in the series to determine the function f(N, T, V).

Figure 7:
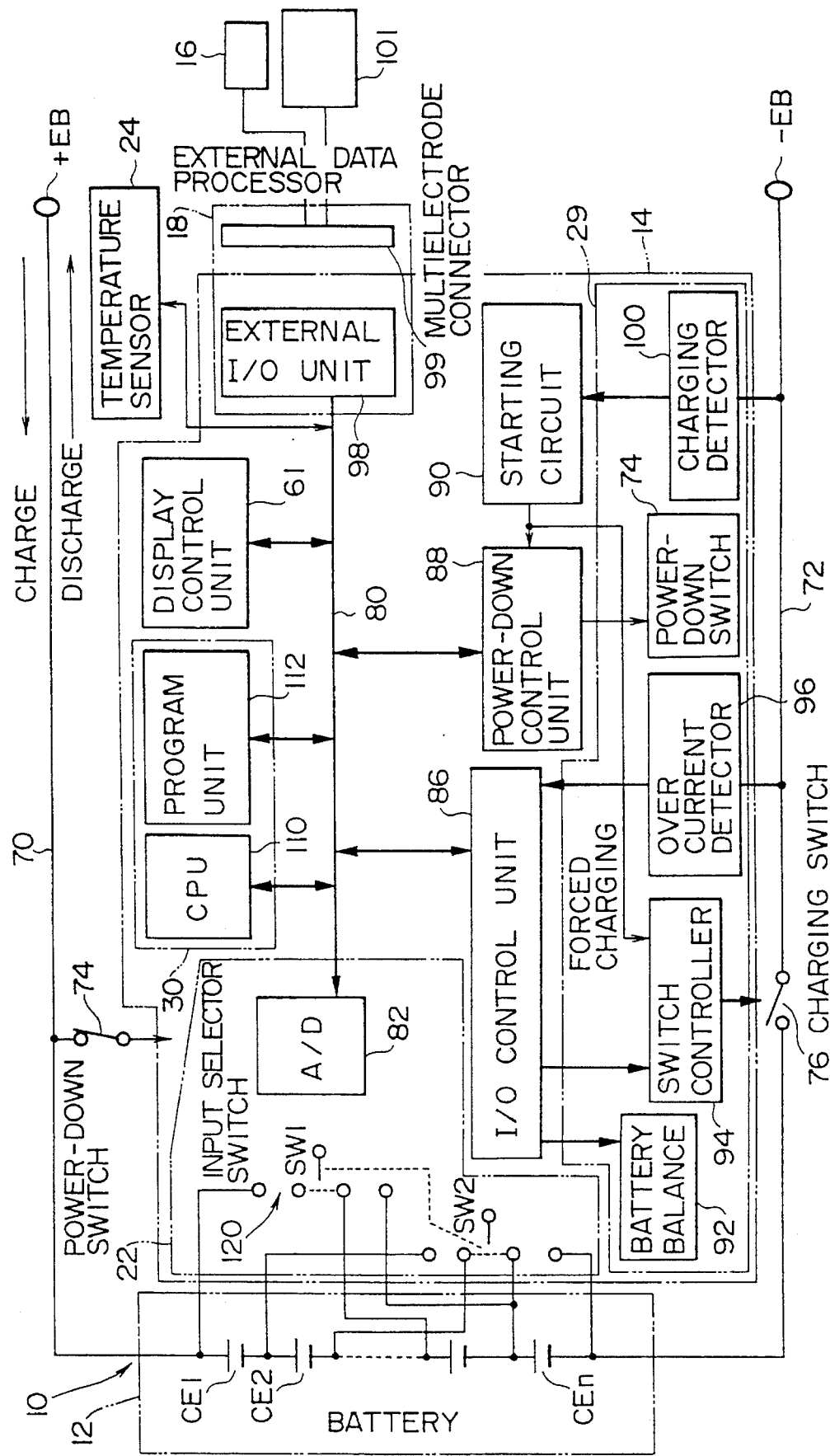
FIG. 7 is a block diagram of the battery unit of FIG. 1.

Referring to FIG. 7 showing the details of the battery unit 10 of FIG. 1, the battery 12 consists of a plurality of cells CE1, CE2, . . . and CEn, which will be inclusively referred to as "cells CE", connected in series. A terminal +EB is connected to the anode of the cell CE1, and a terminal −EB connected to the cathode of the cell CEn. The motor of the electric motorcar AM is connected to the terminals +EB and −EB. A power-down switch 74 is connected to a line 70 connecting the terminal +EB to the battery 12, and a charging switch 76 is provided in a line 74 connecting the terminal −EB to the battery 12.

The monitoring unit 14 comprises the microcomputer 30, a bus 80, the voltage measuring unit 22, the current detecting unit 29, an I/O control unit 86, a power-down control unit 88, a starting circuit 90 and an external I/O unit 98. The microcomputer 30 comprises a CPU 110 and a program unit 112. The current detecting unit 29a comprises a battery cell balance 92, a switch controller 94, an overcurrent detector 96 a power-down switch 74 and a charge detector 100.

Connected to the bus 80 are the CPU 110, the program unit 112, an A/D converter 82, the I/O control unit 86, the power-down control unit 88, the external I/O unit 98, a display control unit 61 and the temperature sensor 24. When charging the battery 12, the terminals +EB and −EB are connected to a charging power source, not shown. When the charge detector 100 decides that the battery 12 is overcharged, the starting circuit 90 actuates the power-down control unit 88 to close the power-down switch 74 for the power-down of the battery 12. While the battery 12 is not fully charged, the starting circuit 90 controls the switch controller 94 to close the charging switch 76, whereby the charging current is supplied continuously through the terminals +EB and −EB to charge the battery 12 forcibly. Upon the detection of an overcurrent, the overcurrent detector 96 gives an overcurrent detection signal to the I/O control unit 86.

Figure 8:
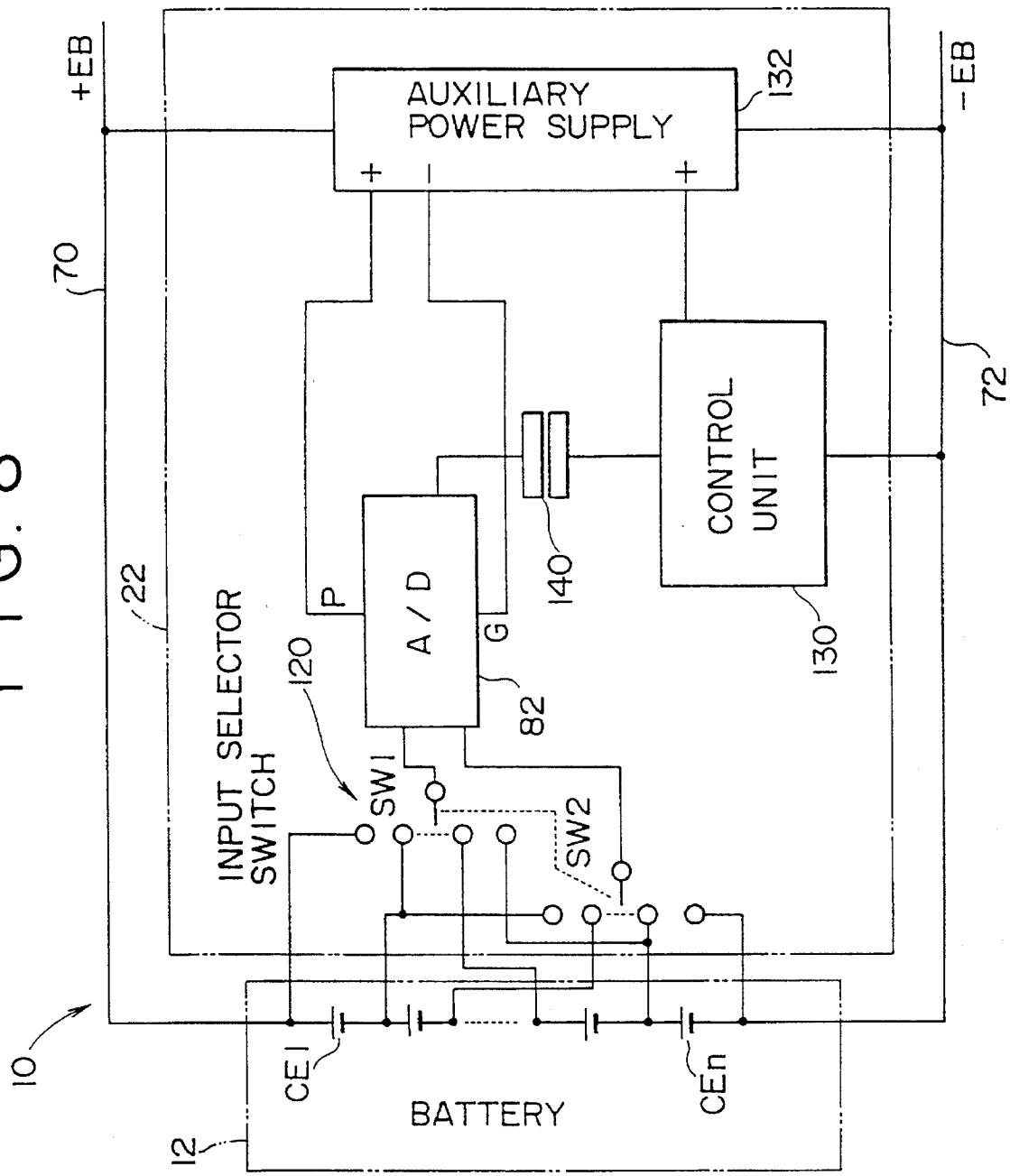
FIG. 8 is a block diagram of an essential portion of the block diagram of FIG. 7.

Referring to FIG. 8 showing the circuit configuration of the voltage measuring unit 22, the voltage measuring unit 22 comprises the A/D converter 82, an input selector switch 120, a control unit 130, a power supply 132 and a photocoupler 140. The anode and cathode of every cell CE are connected to terminals to monitor the supply voltage of every cell CE. Switches SW1 and SW2 are interlocked with the input selector switch 120. The input selector switch 120 is operated to connect the the respective anodes and cathodes of the cells CE sequentially through the switches SW1 and SW2 to the A/D converter 82 to monitor the respective supply voltages of the cells CE sequentially. The A/D converter converts the supply voltage of every cell CE into corresponding digital data. The voltage that appears on the switch SW1 is a reference voltage for determining the supply voltage of every cell CE. The quantity of residual electric energy remaining in every cell CE can be estimated from the measured voltage data on the basis of the known relation between the supply voltage and the quantity of residual electric energy.

Basically, the supply voltage of the cell CE varies with the quantity of discharged electric energy in a mode shown in FIG. 2. However, as mentioned above, the variation of the supply voltage of the cell CE with the quantity of discharged electric energy is dependent on the temperature of the cell CE. Accordingly, the temperature of the cells CE is measured by the temperature sensor 24 (FIG. 7). The temperature sensor 24 may be associated with every cell CE or with a group of the cells CE. The output signal of the temperature sensor 24 is converted into corresponding digital data by the A/D converter 82 or another A/D converter provided especially for converting the output signal of the temperature sensor 24.

Although the temperature T of the cell CE and the supply voltage of the cell CE are the principal factors determining the quantity of residual electrical energy remaining in the cell CE, the number N of charging cycles is related closely to the quantity of residual electrical energy remaining in the cell CE. The number N of charging cycles, degree of discharge, overcharging, overdischarging and differences in properties between the cells CE are important data for estimating the life of the battery 12. These data are processed by the CPU 110 of the microcomputer 30 (FIG. 7) to protect the battery 12, to indicate the quantity of residual electrical energy and the associated information, to store historical data, to control the system and to control input and output signals.

The I/O unit 18 (FIG. 1) comprises the external I/O unit 98 and a multielectrode connector 99 (FIG. 7). The charge on the used electrical energy discharged from the battery 12 is determined by a battery energy billing method, which will be described hereinafter.

Information necessary for billing is given through the I/O unit 98 and the multielectrode connector 99 to the host computer 101. Since calculation for billing deals with many factors, complex procedures for changing unit energy price, estimating the life and statistical processes, it is practically desirable to carry out calculation for billing by the host computer 101. It is effective to correct or change the computation procedures of the CPU by a neural network, which will be described later, on the basis of empirical data obtained by high-level processes.

For example, the quantity of residual electrical energy WH can be determined by multiplying the degree of deterioration of the battery 12 by a quantity of residual electrical energy estimated from the voltage measured by the voltage measuring unit 22 (FIG. 7) as expressed by expression (3). When the discharged battery 12 is replaced with a fully charged battery 12, the charge on the used electrical energy of the discharged battery 12 may be determined by multiplying the remainder of the subtraction of the quantity of effective residual electrical energy WH of the discharged battery 12 from the quantity WH of effective residual electrical energy of the fully charged battery 12 by a constant as expressed by expression (4). The constant is a unit energy charge including a commission for the supplier, a working cost, a depreciation cost of the battery unit 10 and the like.

$$\begin{pmatrix}\text{Quantity of}\\ \text{effective residual}\\ \text{electrical energy}\end{pmatrix} = \begin{pmatrix}\text{Degree}\\ \text{of}\\ \text{deterioration}\end{pmatrix} \times \begin{pmatrix}\text{Estimated quantity}\\ \text{of Residual}\\ \text{electrical energy}\end{pmatrix} \quad (3)$$

$$(\text{Charge}) = \left\{\begin{pmatrix}\text{Quantity of}\\ \text{effective electrical}\\ \text{energy of}\\ \text{new battery}\end{pmatrix} - \begin{pmatrix}\text{Quantity of}\\ \text{effective electrical}\\ \text{energy of}\\ \text{old battery}\end{pmatrix}\right\} \times (\text{Constant}) \quad (4)$$

Since the battery 12 is concealed in most cases, the display 16 is disposed in a place where the information displayed on the display 16 can be easily seen, such as on a control panel, and connected to the external I/O unit 98. Restrictive information for restricting the operation of the motor of the electric motorcar AM according to the condition of the battery 12 is given through the external I/O unit 98 to a motor controller for controlling the operation of the motor of the electric motorcar AM, and may be displayed on both the internal display control unit 61 of the monitoring unit 14, and the external display 16. A maximum current for the motor of the electric motorcar AM is lowered when the quantity of residual electrical energy remaining in the battery 12 is comparatively small to extend the time in which the battery will be fully discharged.

When the supply voltage of the battery 12 is very high, the circuit elements of the battery unit 10, such as ICs which operate on a voltage in the range of several volts to ten and odd volts, are unable to withstand the very high supply voltage of the battery 12. In such a case, the voltage measuring unit 22 uses an auxiliary power supply 132 shown in FIG. 8. The AC converter 82 is connected to terminals P and G connected to an anode of the power supply 132, and a ground terminal of the power supply 132, isolated from the terminal –EB. The voltage across the terminals P and G is maintained at a fixed voltage of several volts.

When the input selector switch 120 is operated, the potential of the terminal G relative to the terminal –EB changes. The control unit 130 is connected to another positive terminal of the power supply 132 and the terminal –EB as a ground terminal.

The A/D converter and the control unit 130 are interconnected by the photocoupler 140 to transmit the output signals of the A/D converter to the control unit 130. Accordingly, the controller 130 is not affected by the variation of the voltage at the terminal G. The photocoupler 140 must transmit signals representing digital data and control data in a unidirectional manner or bidirectional manner. Different signals may be transmitted respectively by separate photocouplers or may be coded in serial data and the serial data may be transmitted by a single photocoupler.

The switches SW1 and SW2 of the input selector switch 120 are relays or rotary switches. Since the input selector switch 120 is driven by part of the output power of the battery 12, it is desirable that the input selector switch 120 is of a type that can be driven by very small power. Preferably, the switches SW1 and SW2 are self-holding relays or intermittent rotary switches. Similarly, the battery unit 10 is constructed in a power-saving configuration. For example, the CPU 110 uses a clock of the lowest possible frequency, a liquid crystal display is used as the display 16, and power is supplied to the A/D converter 82 only when measuring the voltage.

The battery 12 is rarely overdischarged when the battery unit 10 is applied to the electric motorcar AM. However, it is desirable to provide the battery unit 10 with the power-down switch 74 and the power-down control unit 88 as shown in FIG. 7 for the worst. The memories of the monitoring unit 14 are backed up by a backup power supply to hold the contents thereof in a power-down mode.

Figure 9:
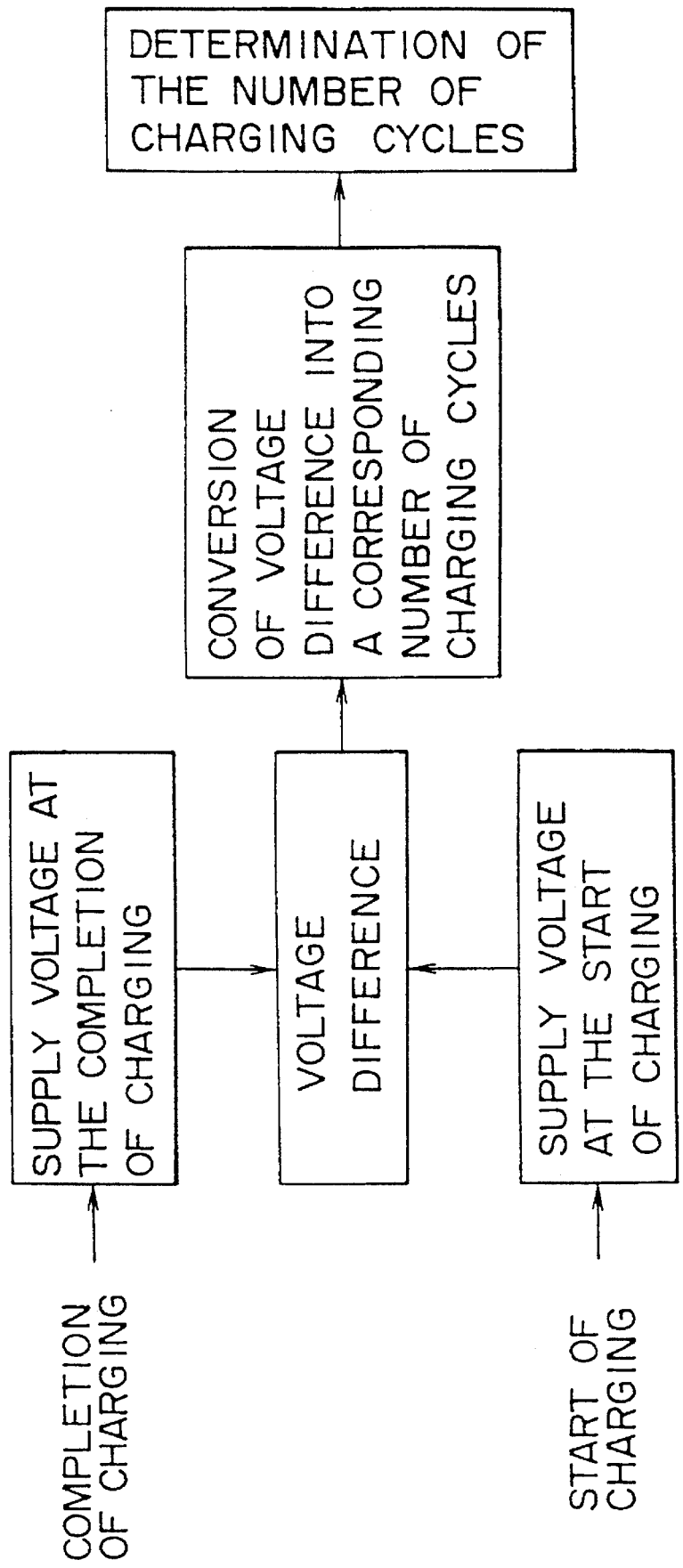
FIG. 9 is a flow chart of a procedure for determining the degree of discharge for determining the number of charging cycles.

FIG. 9 shows a counting circuit for counting the number N of charging cycles. The number N of charging cycles is an important data for estimating the life of the battery 12. However, if a charging cycle for charging the battery 12 after the same has been discharged to a high degree and a charging cycle for charging the battery 12 after the same has been discharged to a low degree are counted equally as one charging cycle, the life of the battery 12 cannot be accurately estimated and charge on the used electrical energy cannot be accurately determined on the basis of the number N of charging cycles. Accordingly, the supply voltage of the battery 12 at the start of charging and the supply voltage of the same at the end of charging are recorded and compared to determine the voltage difference, and the voltage difference is converted into a count of charging cycle. For example, if the voltage difference is a maximum voltage difference, namely, the difference between the supply voltage of the battery 12 when fully charged and that of the same when fully discharged, the count n of the charging cycle is one, and if the voltage difference is smaller than the maximum voltage difference, the count n of the charging cycle is a decimal fraction. The CPU 110 of the monitoring unit 14 (FIG. 7) counts a charging cycle and determines the count n of the charging cycle.

Preferably, differences between the cells CE of the battery 12, the temperature of the battery 12 and the charging-discharging mode in which the battery 12 is charged and discharged are taken into consideration in correcting the number N of charging cycles. Since the life of the battery 12 is dependent on many factors, it is effective to process data statistically when estimating the life of the battery 12. Practically, the values of each factor are classified into groups, for example, voltage differences are classified into ten groups, and conversion factors are assigned to the groups. The statistical processing of the data may be carried out by an external CPU or the CPU of the external host computer 101. When an external CPU is used for the statistical processing of the data, the life of the battery 12 may be estimated on the basis of a factor for estimating the life, such as the impedance of the battery 12, and the estimated life may be calibrated by the CPU 110.

Figure 10:
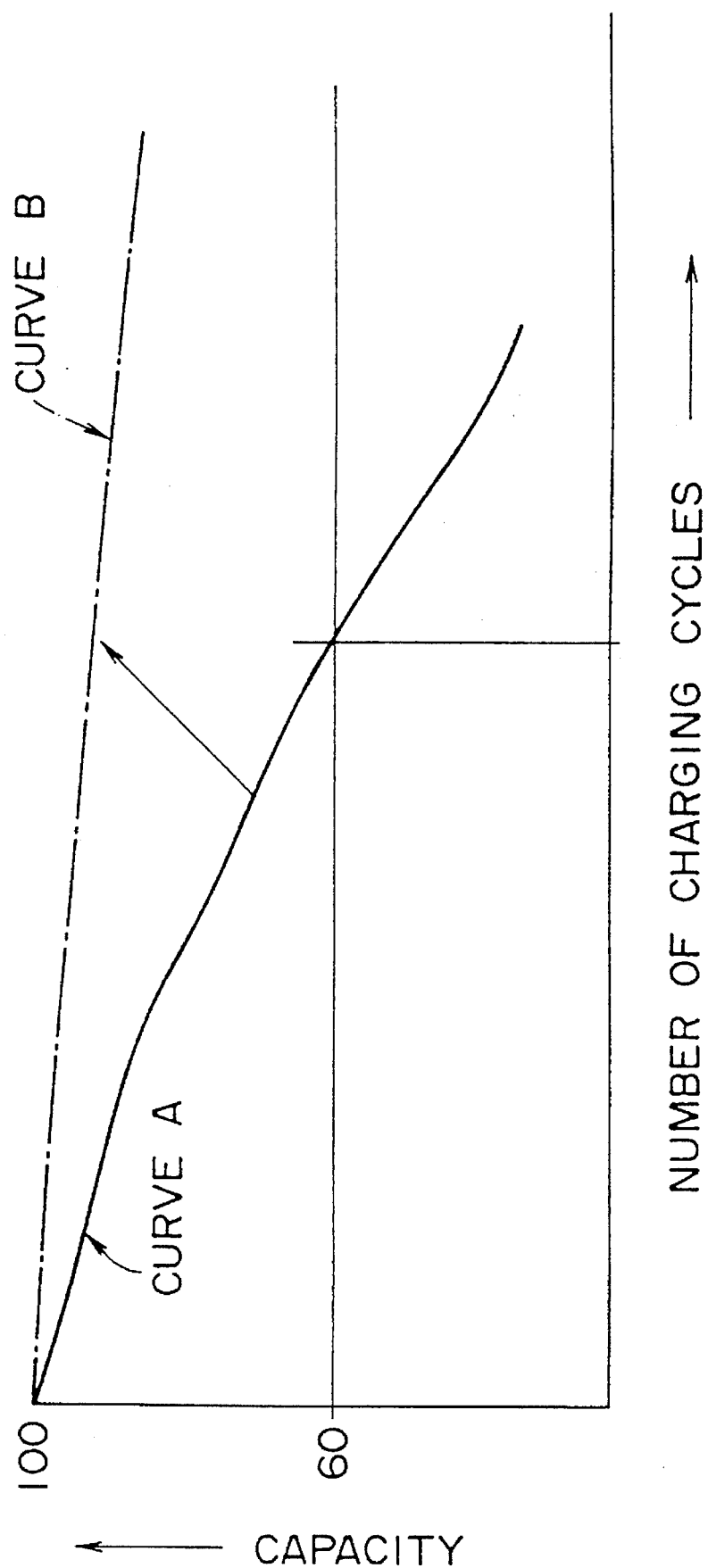
FIG. 10 is a graph showing the dependence of the variation of the capacity of a battery with the number of charging cycles on the degree of discharge.

FIG. 10 is a graph showing the variation of the capacity of the battery 12 with the number N of charging cycles for different charging-discharging modes, in which a curve A indicates the variation of the capacity of the battery 12 with the number N of charging cycles when a fully charged state and a fully discharged state are repeated alternately, and a curve B indicates the variation of the capacity of the battery 12 with the number N of charging cycles when a half discharged state and a fully charged state are repeated alternately. As is obvious from the comparative observation of the curves A and B, the life of the battery 12 when a fully charged state and a half discharged state are repeated alternately is far longer than that of the same when a fully discharged state and a fully charged state are repeated alternately.

Figure 11:
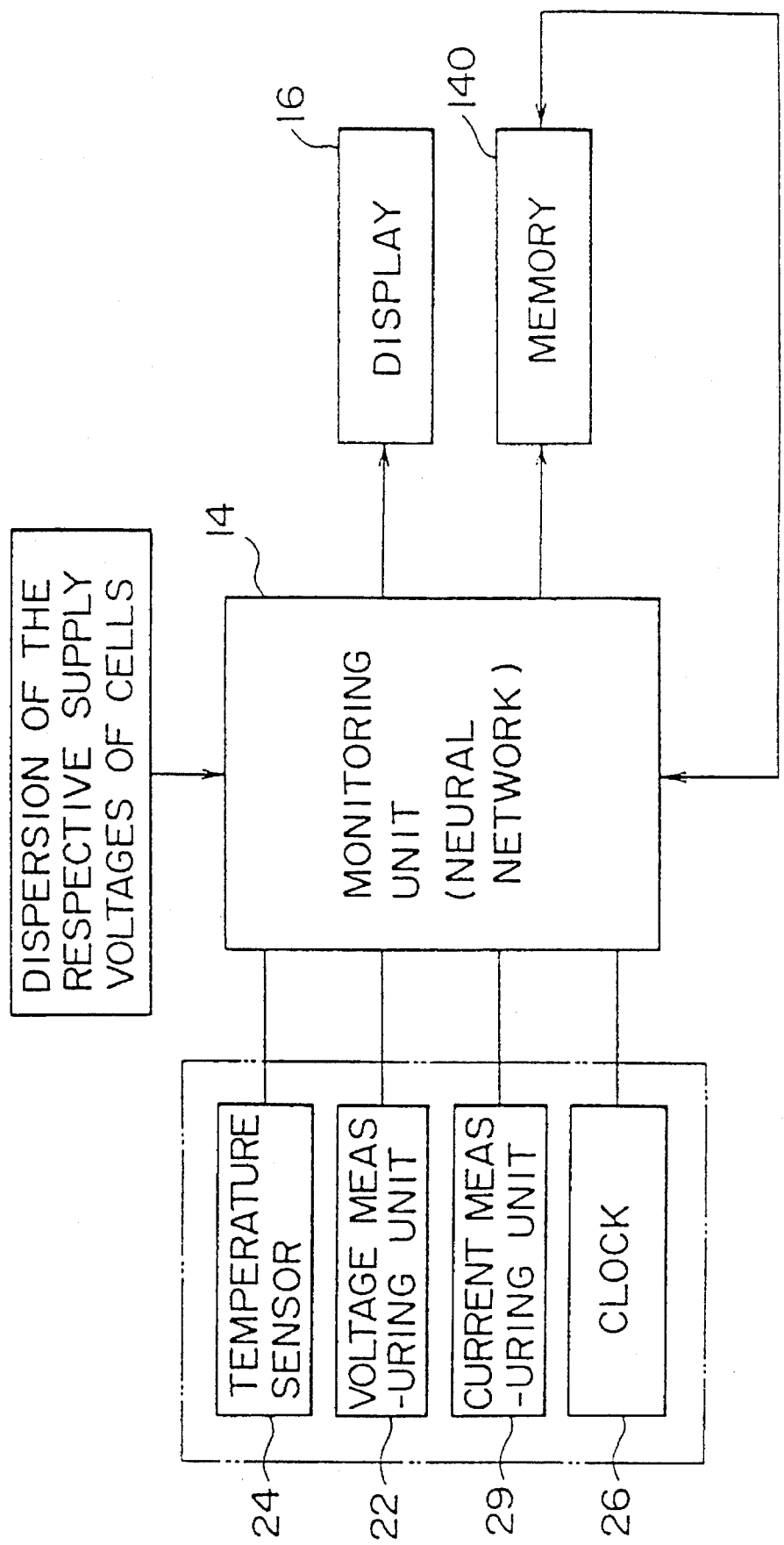
FIG. 11 is a block diagram of a circuit for determining the degree of deterioration of a battery.

The temperature sensor 24, the voltage measuring unit 22 and the current measuring unit 29 (FIGS. 1 and 7) provide data for estimating the degree of deterioration of the battery 12, and the degree of deterioration of the battery 12 is displayed. As shown in FIG. 11, when determining the degree of deterioration of the battery 12 on the basis of the data provided by the foregoing measuring devices, the voltage drop ratio, namely, the drop of the supply voltage per unit electrical energy, determined in the preceding discharge cycle is used, because the greater the number N of charging cycles, the greater is the voltage drop ratio. When the battery 12 consists of a plurality of cells CE, the dispersion of the respective supply voltages of the cells CE is examined to see if there is any cells CE unable to function normally.

Many parameters of the life of the battery 12 may be weighted empirically by a neural network included in a program stored in the program unit 112 of the monitoring unit 14 (FIG. 7). Information about the battery 12, the present degree of deterioration and the data of manufacture of the battery 12 are stored in a memory 140 for use by the neural network of the monitoring unit 14. The degree of deterioration, the number N of charging cycles and the quantity of residual electrical energy WH are displayed on the display 16.

Figure 12:
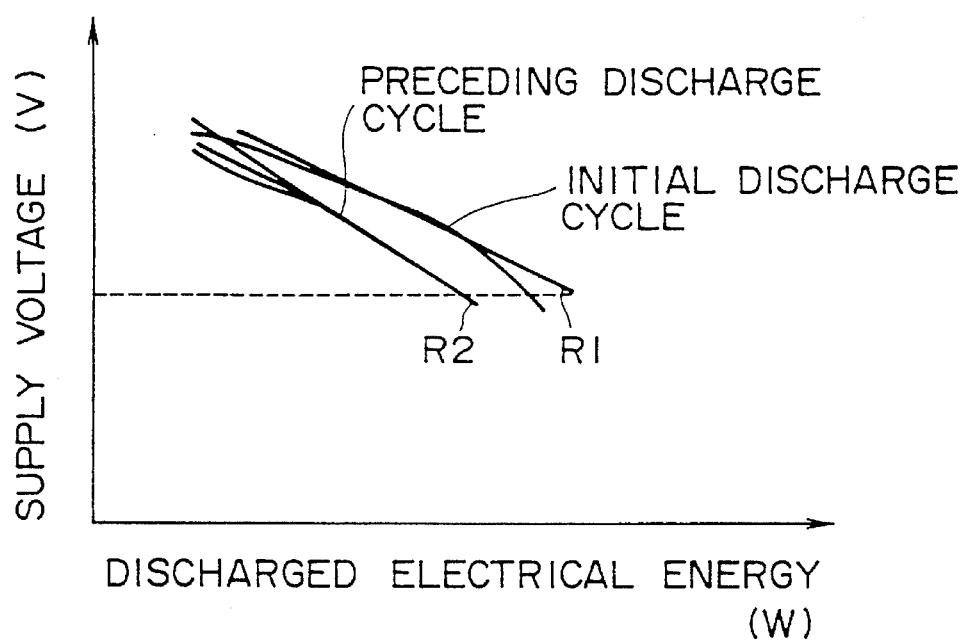
FIG. 12 is a graph showing the variation of the output voltage of a battery with the quantity of used electrical energy.
Figure 13:
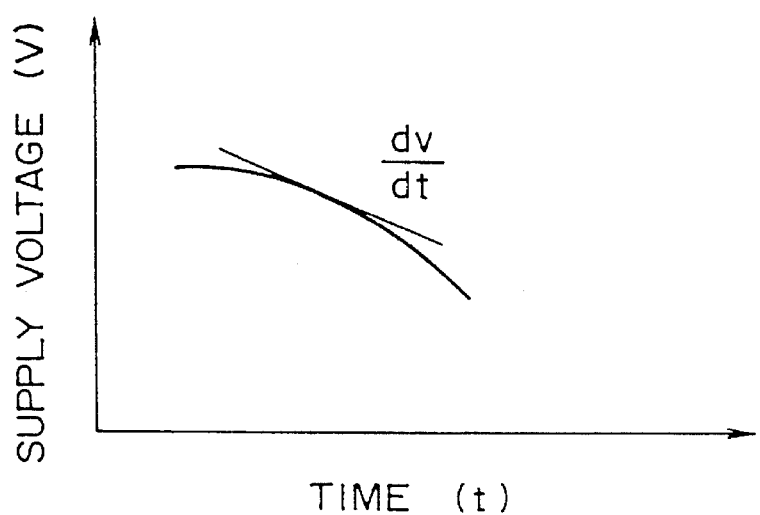
FIG. 13 is a graph showing the variation of the output voltage of a battery with time.

FIG. 12 shows the variation of the supply voltage v of the battery 12 with the quantity w of discharged electrical energy. As shown in FIGS. 12 and 13, the derivative dv/dw in the preceding discharging cycle is greater than that in the first discharging cycle, and the derivative dv/dt in the preceding discharging cycle is large, which indicates that the degree of deterioration of the battery 12 is considerably large. In FIG. 12, points R1 and R2 correspond to quantities of discharged electrical energy at a limiting voltage. The use of the derivative dv/dt for estimating the degree of deterioration improves the reliability of the estimated degree of deterioration, and the management of the battery 12 on the basis of the reliable degree of deterioration is an effective means for preventing troubles attributable to the malfunction of the battery 12. When the degree of deterioration of the battery 12 is determined accurately, the quantity of residual electrical energy remaining in the battery 12 can be accurately estimated and the charge on the used electrical energy can be accurately determined.

When the user uses the battery unit 10 incorrectly, for example, if the battery 12 is short-circuited or if the battery 12 is used at a high power discharge rate exceeding the rated power discharge rate of the battery 12, the deterioration of the battery 12 will be accelerated. Therefore, the estimated degree of deterioration may be incremented according to the value of the derivative dAH/dt to enhance the reliability of the estimated degree of deterioration.

The degree of deterioration need not necessarily be determined by the monitoring unit 14 comprising a microcomputer; the degree of deterioration may be estimated through the analysis of the condition of the battery 12 during charging, and a record of the estimated degree of deterioration may be attached to the battery 12. The degree of deterioration of a lithium-ion battery can be estimated through the measurement of the impedance of the lithium-ion battery. The degree of deterioration may be simply represented by the number N of charging cycles. If the reduction of the storage capacity of the battery is insignificant, the quantity of residual electrical energy may be estimated only by the voltage measuring unit and the charge on the used electrical energy may be calculated by using the expression (4). A term representing the depreciation cost may be added to the expression (4).

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A battery unit comprising:

a battery;

monitoring means for determining the quantity of residual electrical energy remaining in the battery, wherein said monitoring means includes a computing means for calculating the quantity of residual electrical energy remaining in the battery as a function of voltage information, temperature information, and the number of charging cycles;

wherein the monitoring means further comprises a count correcting means for correcting the number of charging cycles on the basis of at least one of the degree of discharge of the battery during a charging-discharging mode, the temperature of the battery, and differences between cells of the battery.

2. A battery unit according to claim 1, further comprising a display means for displaying information about the number of charging cycles.

3. A battery unit according to claim 1, further comprising an output means for providing information about the number of charging cycles.

4. A battery unit according to claim 1, wherein the monitoring means comprises a temperature sensor for sensing the temperature of the battery, and at least one of a display means for displaying the temperature of the battery sensed by the temperature sensor and a temperature signal output means.

5. A battery unit according to claim 1, wherein the monitoring means comprises a voltage measuring means, and at least one of a display means for displaying a voltage measured by the voltage measuring means and a voltage signal output means.

6. A battery unit according to claim 1, wherein the monitoring means further comprises at least one of a display means for displaying the quantity of residual electric energy remaining in the battery and an output means for sending out a signal representing the calculated quantity of residual electrical energy remaining in the battery.

7. A battery unit according to claim 1, further comprising a battery identification signal output means for sending out a battery identification signal representing the type of the battery.

8. A battery unit according to claim 6, further comprising a connecting device connected to the output means for sending out a signal representing the calculated quantity of residual electrical energy remaining in the battery.

9. A battery unit according to claim 8, wherein the connecting device is provided with an identification signal output means for sending out a battery identification signal representing the type of the battery.

10. A battery unit according to claim 1, wherein the battery is a lithium-ion secondary battery.

11. A battery unit according to claim 1, wherein said monitoring means comprises:

a voltage measuring unit connected to the terminals of said battery or to individual cells of the battery for providing said voltage information;

a temperature sensor measuring the temperature of said battery or near said battery for providing said temperature information; and a monitoring unit for providing said number of charging cycles.

12. A battery unit according to claim 1, wherein said monitoring unit counts the number of battery charging cycles and provides said count as said number of charging cycles.

13. A battery unit according to claim 11, wherein said monitoring unit obtains said number of charging cycles information based on the derivative of the discharge characteristic of said battery and temperature.

14. A battery unit according to claim 11, wherein said monitoring unit comprises a microcomputer having a memory for storing data correlating the degree of deterioration of the battery with the number of charging cycles.

15. A battery unit according to claim 1, wherein said monitoring means determines the degree of deterioration of said battery.

16. A method for determining a quantity of effective residual electrical energy remaining in a battery comprising the steps of:

(a) determining a degree of deterioration of said battery;

(b) estimating a quantity of residual electrical energy; and (c) multiplying said degree of deterioration determined in step (a) and said quantity estimated in step (b) to obtain said quantity of effective residual electrical energy.

17. A method for determining an amount to be charged for electrical energy used in a used battery when said used battery is replaced by a new battery comprising the steps of:

determining the quantity of effective residual electrical energy in said used battery according to the method of claim 16;

determining the quantity of effective residual electrical energy in said new battery according to the method of claim 16;

multiplying the difference between the quantities of the effective residual electrical energy in said used and new batteries by a unit energy charge.

\* \* \* \* \*